United States Patent
Huang et al.

(10) Patent No.: US 10,212,775 B2
(45) Date of Patent: Feb. 19, 2019

(54) DRIVING APPARATUS FOR A LIGHT EMITTING DEVICE AND METHOD FOR THE SAME

(71) Applicant: STMicroelectronics (Shenzhen) R&D Co. Ltd, Nanshan (CN)

(72) Inventors: Tao Tao Huang, Shenzhen (CN); Yi Jun Duan, Shenzhen (CN)

(73) Assignee: STMicroelectronics (Shenzhen) R&D Co. Ltd, Nanshan (CN)

( * ) Notice: Subject to any disclaimer, the term of this patent is extended or adjusted under 35 U.S.C. 154(b) by 0 days.

(21) Appl. No.: 15/956,598

(22) Filed: Apr. 18, 2018

(65) Prior Publication Data

US 2018/0242419 A1    Aug. 23, 2018

Related U.S. Application Data

(62) Division of application No. 15/486,652, filed on Apr. 13, 2017, now Pat. No. 9,980,333, which is a division
(Continued)

(30) Foreign Application Priority Data

Aug. 9, 2013 (CN) .......................... 2013 1 0361941

(51) Int. Cl.
*H05B 33/08* (2006.01)
*H03F 3/45* (2006.01)

(52) U.S. Cl.
CPC ..... *H05B 33/0851* (2013.01); *H03F 3/45215* (2013.01); *H05B 33/0812* (2013.01); *H05B 33/0815* (2013.01); *H05B 33/0827* (2013.01); *H05B 33/0887* (2013.01); *H03F 2200/351* (2013.01); *Y02B 20/341* (2013.01); *Y02B 20/347* (2013.01)

(58) Field of Classification Search
CPC ............ H05B 33/0812; H05B 33/0815; H05B 33/0827; H05B 33/083; H05B 33/0833; H05B 33/0842; H05B 33/0848; H05B 33/0851

See application file for complete search history.

(56) References Cited

U.S. PATENT DOCUMENTS

| | | | | |
|---|---|---|---|---|
| 6,239,716 B1* | 5/2001 | Pross | ....................... | G09G 3/14 315/200 A |
| 7,675,246 B2* | 3/2010 | Chiang | .............. | H05B 33/0815 315/291 |

(Continued)

FOREIGN PATENT DOCUMENTS

CN          102467885          5/2012

OTHER PUBLICATIONS

First Office Action and Search Report for co-pending Appl. No. CN201310361941.3 dated Oct. 11, 2016 (6 pages).

*Primary Examiner* — Jason Crawford
(74) *Attorney, Agent, or Firm* — Crowe & Dunlevy

(57) ABSTRACT

A driving apparatus configured to drive a light emitting device includes a driving current source module operable to supply current to the light emitting device via a node during operation. A protection module coupled to the node and the driving current source module selectively injects current to the node during operation. The driving current source module is controlled based on a detection result of a voltage on the node.

12 Claims, 12 Drawing Sheets

Related U.S. Application Data of application No. 14/966,662, filed on Dec. 11, 2015, now Pat. No. 9,661,701, which is a division of application No. 14/454,867, filed on Aug. 8, 2014, now Pat. No. 9,370,059.

(56) References Cited

U.S. PATENT DOCUMENTS

| | | | |
|---|---|---|---|
| 9,370,059 B2 | 6/2016 | Duan et al. | |
| 9,603,220 B2 | 3/2017 | Kang | |
| 9,661,701 B2 | 5/2017 | Huang et al. | |
| 2008/0084246 A1* | 4/2008 | Galal | H03F 1/301 330/290 |
| 2008/0284408 A1* | 11/2008 | Kunst | H05B 33/0812 323/351 |
| 2009/0174338 A1* | 7/2009 | Muramatsu | H05B 33/0818 315/250 |
| 2009/0289559 A1* | 11/2009 | Tanaka | H05B 33/0815 315/185 R |
| 2009/0302776 A1 | 12/2009 | Szczeszynski | |
| 2010/0109570 A1* | 5/2010 | Weaver | H05B 33/0812 315/295 |
| 2010/0148681 A1* | 6/2010 | Kuo | H05B 33/0818 315/193 |
| 2011/0109249 A1* | 5/2011 | Liu | H05B 33/0809 315/307 |
| 2011/0181199 A1* | 7/2011 | Lin | H05B 33/0818 315/291 |
| 2012/0081039 A1 | 4/2012 | Yang et al. | |
| 2012/0153833 A1* | 6/2012 | Mikani | H05B 33/0812 315/122 |
| 2012/0176039 A1* | 7/2012 | Sato | H05B 33/0893 315/129 |
| 2013/0009556 A1 | 1/2013 | Szczeszynski et al. | |
| 2013/0009557 A1 | 1/2013 | Szczeszynski et al. | |
| 2013/0015781 A1 | 1/2013 | Kanemitsu et al. | |
| 2013/0049599 A1* | 2/2013 | Logiudice | H05B 33/083 315/122 |
| 2013/0050288 A1* | 2/2013 | Kang | H05B 33/0815 345/690 |
| 2014/0049173 A1 | 2/2014 | Le | |
| 2014/0055045 A1 | 2/2014 | Raval et al. | |
| 2015/0084541 A1* | 3/2015 | Jung | H05B 33/0812 315/291 |
| 2015/0245434 A1* | 8/2015 | Xu | H05B 33/0815 315/291 |

\* cited by examiner

DRIVING APPARATUS FOR A LIGHT EMITTING DEVICE AND METHOD FOR THE SAME

CROSS-REFERENCE TO RELATED APPLICATIONS

This application is a divisional application from U.S. patent Ser. No. 15/486,652 filed Apr. 13, 2017, which is a divisional application from U.S. patent Ser. No. 14/966,662 filed Dec. 11, 2015, now U.S. Pat. No. 9,661,701, which is a divisional application from U.S. patent Ser. No. 14/454,867 filed Aug. 8, 2014, now U.S. Pat. No. 9,370,059, which claims priority from Chinese Application for Patent No. 201310361941.3 filed Aug. 9, 2013, the disclosures of which are incorporated by reference.

TECHNICAL FIELD

Embodiments generally relate to the field of photoelectric technology, and more specifically to a driving apparatus for driving a light emitting device and a method for the same.

BACKGROUND

Light emitting devices such as light emitting diodes (LED) have been prevalently applied nowadays. Generally, a light emitting device is driven by a corresponding driving apparatus, e.g., referring to FIG. 1, one end of the light emitting module 1 is provided a voltage $V_B$ for operation, while the other end is connected to a driving module 2 so as to be driven by the driving module 2.

FIG. 2 is another example of a light emitting device and a driving apparatus in the prior art, wherein the light emitting device is a LED array such as active matrix organic light emitting diode (AMOLED), while the driving apparatus is a driving current source module. In FIG. 2, the LED array has a plurality of LED strings, e.g., LED strings L11, L12, ..., L1n-1 and L1n, and LED strings Lm1, Lm2, Lmn-1 and Lmn. Similar to FIG. 1, a boost module 3 provides voltage VB to each LED string, and each LED string is driven by driving current source modules 21, 22, ..., 2m.

On one hand, light emitting devices such as LED array often fail. FIGS. 3A and 3B show two categories of faults, wherein for the convenience of illustration, only one LED string is shown, while other LED strings are omitted. For example, with reference to FIG. 3A, one category of faults is that one end of the LED string connected in series with the driving current source module is grounded, which causes an uncontrollable driving current source module, and much worse, it will even damage the LED array and the driving current source module. The other category of faults is that an open circuit occurs in the LED string. For example, with reference to FIG. 3B, the open circuit (indicated with an "X") occurs between the voltage $V_B$ provided by the boost module and the LED L11. It may be understood that the open circuit may also occur between for example L11 and L12, or L1n-1 and L1n, or L1n and the current source. The prior art always employs a complex and independent circuit module to detect the two categories of faults, which raises the cost and makes circuit design more complex. Therefore, there is a need for a driving apparatus which has a simple design and can detect at least a part of the above faults and a corresponding detecting method.

On the other hand, more and more LED applications require that the LED light be dimmable, which requires that the LED driver have different driving capabilities according to the needs so as to change the intensity of the light emitted by the LED. Besides, in a combination of LEDs emitting different colors of light, wherein different colors are mixed to obtain light with a particular light temperature, it is needed that drivers for LEDs of one or more colors can dim light. In a low-light state, a conventional LED driver generally uses a pulse width modulation (PWM) to dim light. At this point, delay always occurs between the PWM signal and the dimming current in the driver, which causes dimming delay, such that the driving current of the LED tends to be inaccurate, which causes the LED light to be overly dimmed and the brightness of the LED panel to be inaccurate. Therefore, a driving apparatus improving response and an improved method are desirable.

SUMMARY

Embodiments intend to at least partially solve or alleviate the above problems.

According to one aspect, there is provided a driving apparatus for driving a light emitting device, comprising: a driving current source module configured to supply current to the light emitting device via a node during operation; a protection module coupled to the node and the driving current source module and configured to selectively inject current to the node during operation and control the driving current source module based on a detection result of a voltage on the node.

According to another aspect, there is provided a display system, comprising a light emitting device and the above driving apparatus for driving the light emitting device.

According to a further aspect, there is provided an electronic device including the above display system.

According to a still further aspect, there is provided a method for protecting a display system, which display system comprises a light emitting device and a driving apparatus for driving the light emitting device, which light emitting device is coupled to a current source of the driving apparatus via a node, which method comprises: disabling the driving current source module before startup of the driving apparatus; injecting current into the node; detecting a voltage on the node; and determining whether to enable or disable the driving apparatus based on the detected voltage.

According to a yet further aspect, there is provided a method for protecting a display system, which display system comprises a light emitting device and a driving apparatus for driving the light emitting device, which light emitting device is coupled to a current source of the driving apparatus via a node, which method comprises: detecting voltage on the node when the driving apparatus is running; disabling the driving current source module when it is detected that voltage of the node is less than a threshold voltage; injecting current into the node; detecting a voltage on the node; and selecting only disabling the driving current source module or disabling the entire driving apparatus based on the detected voltage.

According to a still further aspect, there is provided a driving apparatus for driving a light emitting device, comprising: a driving current source module configured to supply current to the light emitting device via a node during operation, wherein the driving current source module is configured to improve dimming accuracy by reducing delay caused by an operational amplifier included in the driving current source module when dimming in a pulse width modulation (PWM) mode.

According to a still further aspect, there is provided a display system, comprising a light emitting device and the above driving apparatus for driving the light emitting device.

According to a still further aspect, there is provided an electronic device comprising the display system.

According to a still further aspect, there is provided a method for driving a light emitting device, comprising: improving dimming accuracy by reducing delay caused by an operational amplifier in the driving apparatus when dimming in a pulse width modulation (PWM) mode.

In an embodiment, an apparatus comprises: a driving current source module including an operational amplifier coupled to a drive transistor that is configured to supply current to a light emitting device via a node; and a circuit included in the driving current source module that is configured to improve dimming accuracy by reducing delay caused by the operational amplifier upon dimming in a pulse width modulation (PWM) mode.

In an embodiment, an apparatus comprises: a drive transistor having a first conduction terminal, a second conduction terminal and a control terminal; an operational amplifier having a first input, a second input and an output; a first switch coupled between the second input and the second conduction terminal; a second switch coupled between the output and a reference node; wherein the first and second switches are actuated in response to a pulse width modulation (PWM) control signal; a first resistive circuit coupled between the second conduction terminal and the reference node, wherein the first resistive circuit has a variable resistance value; a second resistive circuit coupled between the first input and the reference node; and a control circuit configured to change the variable resistance value in response to a change in logic state of the PWM control signal.

In an embodiment, an apparatus comprises: a drive transistor having a first conduction terminal, a second conduction terminal and a control terminal; an operational amplifier having a first input, a second input and an output; a first switch coupled between the second input and the second conduction terminal; a second switch coupled between the output and a reference node; wherein the first and second switches are actuated in response to a pulse width modulation (PWM) control signal; a first resistive circuit coupled between the second conduction terminal and the reference node; a second resistive circuit coupled between the first input and the reference node, wherein the second resistive circuit has a variable resistance value; and a control circuit configured to change the variable resistance value in response to a change in logic state of the PWM control signal.

In an embodiment, an apparatus comprises: a drive transistor having a first conduction terminal, a second conduction terminal and a control terminal; an operational amplifier having a first input, a second input and an output; a first switch coupled between the second input and the second conduction terminal; a second switch coupled between the output and a reference node; wherein the first and second switches are actuated in response to a pulse width modulation (PWM) control signal; and wherein the operational amplifier includes a differential transconductance stage and a circuit configured to reduce delay by increasing current flowing through the differential transconductance stage in response to a logic state change of the PWM control signal.

A corresponding advantageous effect may be achieved by using some embodiments.

BRIEF DESCRIPTION OF THE DRAWINGS

Some exemplary embodiments are illustrated in the accompanying drawings that are not drawn in proportion. In the accompanying drawings, similar reference numerals represent similar components, wherein.

DETAILED DESCRIPTION OF THE DRAWINGS

Some specific details will be expounded below so as to provide thorough understanding on various aspects of the subject matter as disclosed. However, the disclosed subject matter can also be implemented without these specific details. In some embodiments, known structures and methods for forming a structure associated with a semiconductor device are not described yet so as to avoid ambiguity of the description of other aspects of the present disclosure.

Unless otherwise required in the context, the term "comprise" appearing in the description and the whole text of the appended claims will be interpreted as open inclusion, i.e., interpreted as "including, but not limited to."

In the whole text of the present description, reference to "an embodiment" or "embodiments" means the specific features, structures or characteristics described in conjunction with the embodiment(s) are included in at least one embodiment. Therefore, the phrases "in an embodiment" or "in the embodiment" appearing in various parts throughout the whole text of the present description do not necessary refer to the same aspect. Besides, particular features, structures or characteristics may be combined in any appropriate manner in one or more aspects of the present disclosure.

Figure 4:
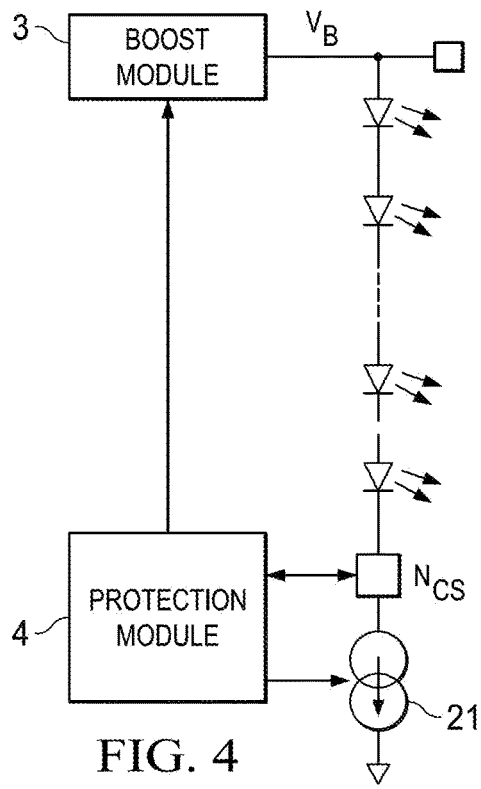
FIG. 4 is an example of a driving apparatus that has a protection module and is configured to drive a light emitting device according to one embodiment.

Now, refer to FIG. 4, in which an arrangement according to one embodiment is presented. In the arrangement, for the sake of illustration, only one LED string is illustrated. Those skilled in the art may understand that more LED strings may be included therein, and the LED string may also be other light emitting device suitable for this occasion.

In FIG. 4, the LED string is powered by a boost module 3 and is coupled in series to a current source via a node $N_{cs}$. Those skilled in the art may understand that the node $N_{cs}$ may be any point between the LED connected to the current source 21 in the LED string and the current source, for example, when the current source is integrated in the driving apparatus while the LED string is integrated into the light emitting device, the node $N_{cs}$ may be a pin of the driving apparatus connected to the light emitting device.

Those skilled in the art may understand that the boost module 3, the protection module 4, and the driving current source module 21 in FIG. 4 may be integrated into an integrated circuit chip or located in a different integrated circuit chips.

As shown in FIG. 4, in one embodiment, the protection module 4 is integrated into the driving apparatus, so as to, for example, be used for detecting two categories of faults as stated above and perform a corresponding protection action. The protection module 4 determines a result of detecting based on a signal from the node $N_{cs}$, and selectively disables the current source 21 or the driving apparatus boost module 3. For example, when it is determined that short circuit exists in the LED string, in order to avoid the current source 21 from being uncontrollable and potential damage of the driving apparatus and light emitting device, the whole driving circuit may be disabled. For example, when it is determined that open circuit occurs in the LED string, it is allowed to only disable the driving current source module 21 corresponding to the LED string.

Those skilled in the art may understand, disable means stopping use of a corresponding device or apparatus. For example, in the case of disabling the current source 21, the current source may be made not to operate by a control signal, or no power is supplied to the current source, or the current source is disconnected from other device, apparatus or circuit and the like so as to be electrically isolated from other device, apparatus or circuit and the like.

Figure 5:
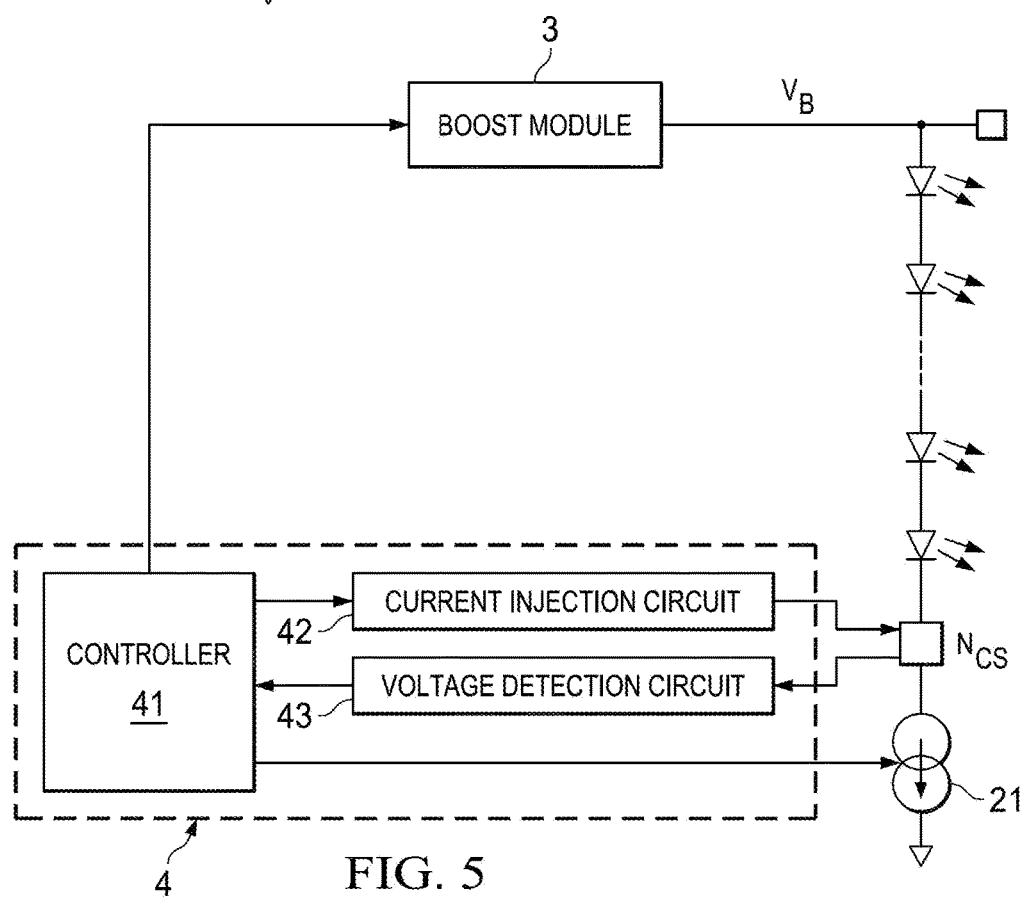
FIG. 5 is an example of a driving apparatus that has a protection module and is configured to drive a light emitting device according to one embodiment.
Figure 6A:
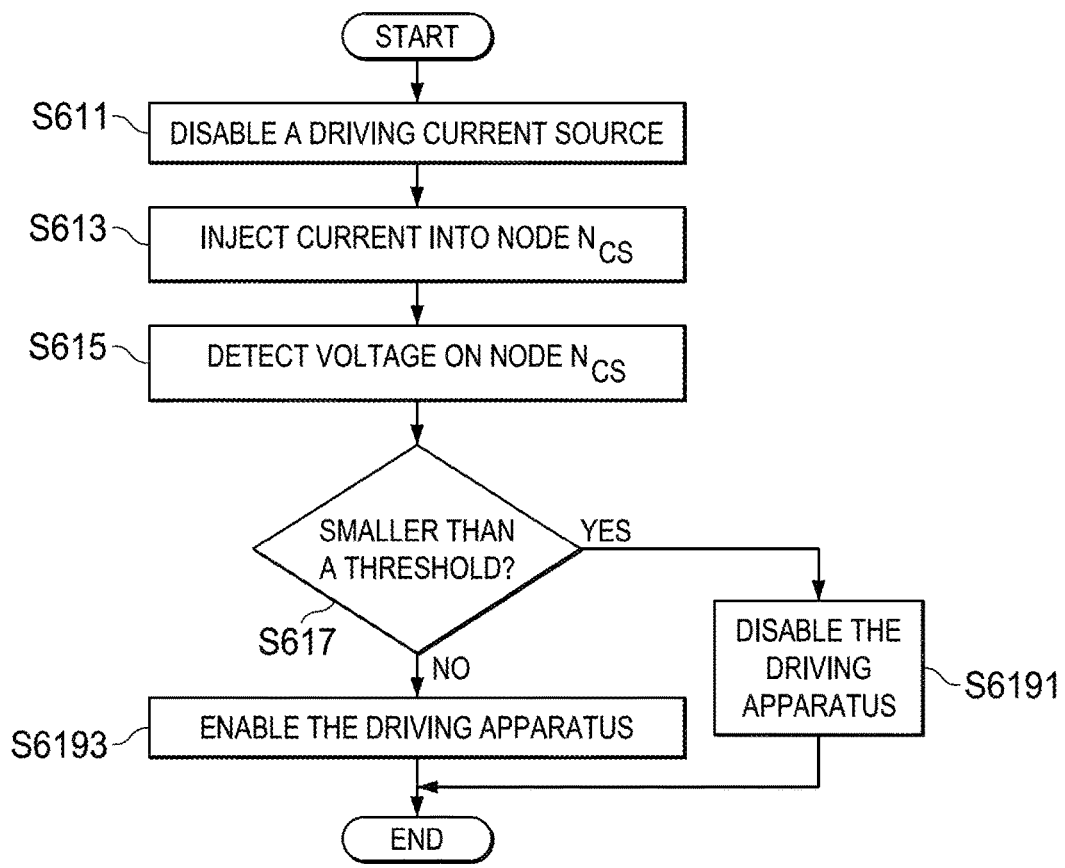
FIG. 6A is a flow chart of an example of a method for detecting a fault and protecting a driving apparatus according to one embodiment.
Figure 6B:
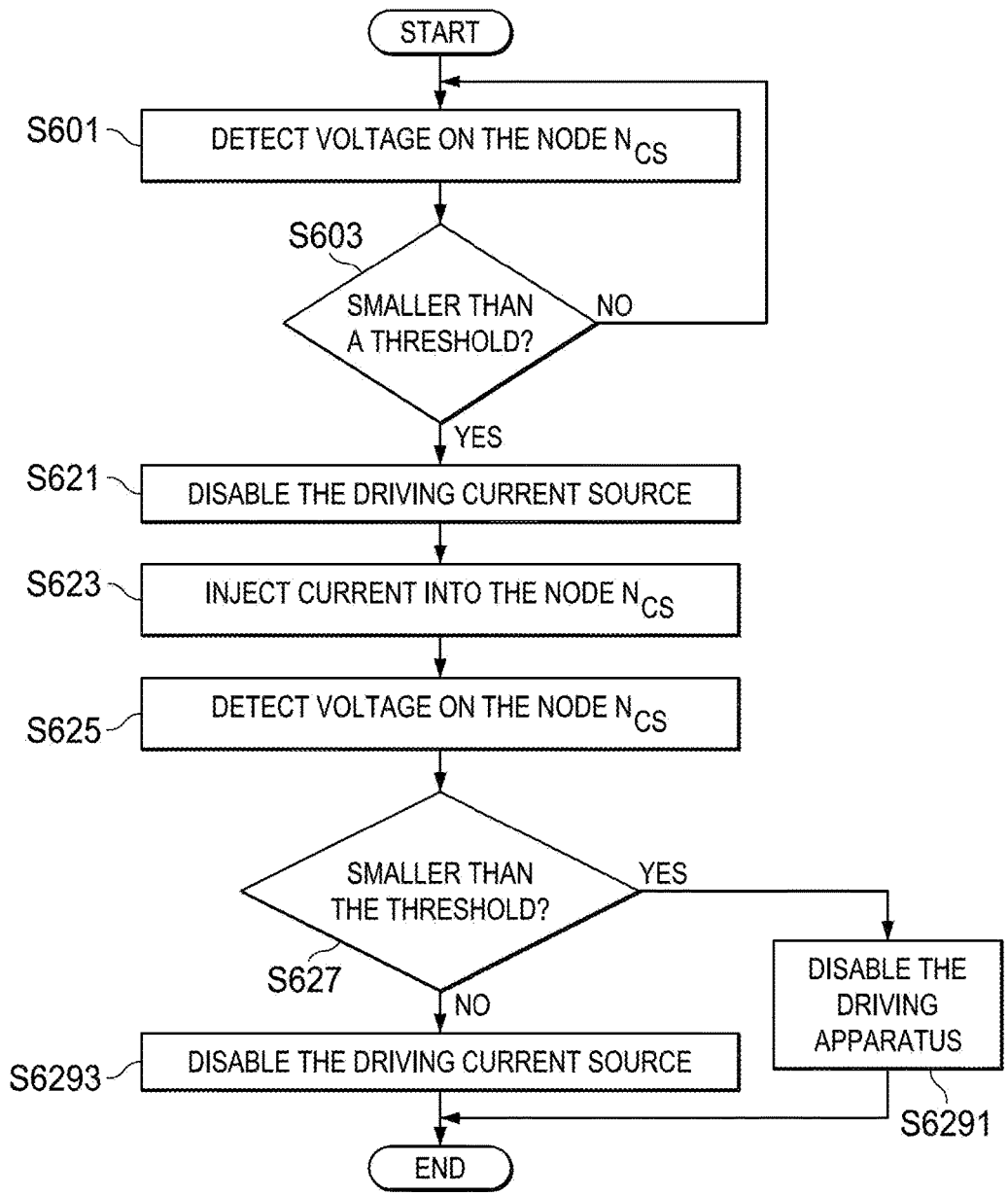
FIG. 6B is a flow chart of an example of a method for detecting a fault and protecting a driving apparatus according to another embodiment.

Hereinafter, operation of a protection module according to one embodiment will be illustrated specifically with reference to FIG. 5, FIG. 6A and FIG. 6B, wherein FIG. 5 is a specific example of a protection circuit 4 coupled to the current source 21 and the boost module 3, FIG. 6A is an example of a method of detecting a fault before startup of the light emitting device such as LED panel, while FIG. 6B is an example of a method of detecting a fault when a light emitting device such as LED panel is operating.

First, with reference to FIG. 5 and FIG. 6A, before startup of a light emitting device such as LED panel, it is desirable that a fault in the light emitting device may be detected so as to avoid potential damage of the device upon startup. For the light emitting device, it is paramount to avoid a situation where the light emitting circuit near the driving current source module 21 is short-circuit grounded.

According to one embodiment, there is provided such a method to detect short-circuit fault before startup of the light emitting device. Before starting the light emitting device and the driving apparatus, the driving current source module 21 is disabled in step S611. As stated above, those skilled in the art would appreciate that disable means stopping use of a corresponding device or apparatus. For example, when the current source 21 is disabled, the current source may be made not to operate by a control signal, or no power is supplied to the current source, or the current source is disconnected from other device, apparatus or circuit and the like so as to be electrically isolated from other device, apparatus or circuit and the like.

Then, in step S613, a controller 41 controls a current injection circuit 42 to inject current into a node $N_{cs}$. The current, for example, may be a small current for example, 100 μA. After continuous injection for a while (e.g., 100 milliseconds), the controller 41 controls the current injection circuit 42 to stop injecting current.

In step S615, the controller 41 controls a voltage detection circuit 43 to detect voltage on a node $N_{cs}$. In another scenario, the controller 41 may continuously receive voltage from a voltage detecting circuit 43. In a further example, the controller 41 may also be directly coupled to the node $N_{cs}$ to obtain the voltage on the node $N_{cs}$, thereby sparing the voltage detecting circuit 43. Besides, those skilled in the art may select the amount and duration of current injection based on the specific conditions of the light emitting device and the driving apparatus that are designed in actuality.

Next, in step S617, the controller 41 determines whether a voltage obtained on the node $N_{cs}$ is smaller than a threshold $V_{TH1}$ (e.g., 100 mV). Those skilled in the art may understand, the value of the threshold $V_{TH1}$ may be selected based on the specific conditions of the light emitting device and the driving apparatus that are actually designed. When the voltage on the node $N_{cs}$ is smaller than the threshold $V_{TH1}$, for example, the voltage on the node $N_{cs}$ is 0V, it means the node $N_{cs}$ is grounded. In other words, the LED near the driving current source module 21 in the LED string is grounded. Therefore, in step S619, the driving apparatus is disabled. Disabling the driving apparatus may comprise: disabling the current injection circuit 42, processor 41, voltage detecting circuit 43, boost module 3, and driving current source module 21, and the like, for example, disabling the driving module 4 or other circuits in the integrated circuit chip.

However, when the voltage on the node $N_{cs}$ is greater than or equal to the threshold $V_{TH1}$, it means the light emitting device does not have the above short-circuit circumstance. The reason is that at this point, it is similar to the scenario of charging a capacitor; at the two ends of the light emitting device such as LED string, a certain voltage exists due to injection of current for a period of time. At this point, the device may start. Therefore, in step S6193, the controller provides a device-startup signal to start the driving apparatus and light emitting device. Those skilled in the art may understand, at this point, open-circuit scenario may also possibly exist in a light emitting device such as an LED panel. However, open circuit generally does not cause the driving current source module 21 to operate uncontrollably and will not generally cause damage to the device; therefore, the driving apparatus and the light emitting device may still be started.

A flow of detecting whether faults exist in a light emitting device before startup of the device has been described above. Hereinafter, examples of detecting whether a fault exists when the light emitting device is running will be described in detail with reference to FIG. 5 and FIG. 6B.

With reference to FIG. 5 and FIG. 6B, when the driving apparatus and the light emitting device are running, in step S601, the controller 41 controls the voltage detection circuit 43 to continuously detect the voltage on the node $N_{cs}$. As shown in step S603, it is determined whether the voltage on the node $N_{cs}$ is smaller than a threshold voltage $V_{TH2}$. When the driving apparatus and the light emitting device operate normally, the voltage on the node $N_{cs}$ is greater than or equal to the threshold $V_{TH2}$. At this point, the flow returns to step S601 to perform detection. The threshold voltage $V_{TH2}$ may be identical to or different from the threshold voltage $V_{TH1}$, which is determined dependent on the actual circuit design needs. When it is determined that the voltage on the node $N_{cs}$ is smaller than the threshold voltage $V_{TH2}$, a fault occurs, and at this point, it needs to determine the fault type to perform corresponding processing.

Next, in step S621, similar to step S611, a driving current source module 21 is disabled. Next, step S623 of injecting current into the node $N_{cs}$, step S625 of detecting a voltage on the node $N_{cs}$, step S627 of determining whether the node $N_{cs}$ is smaller than the threshold are performed in sequence. Steps S621, S623, S625, and S627 are similar to steps S621, S623, S625, and S627, respectively, which will not be detailed here.

Figure 1:
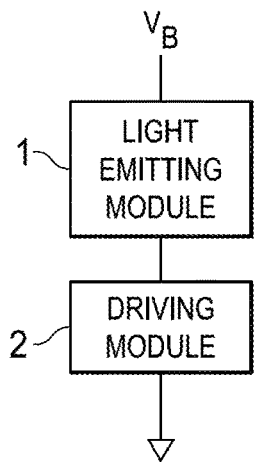
FIG. 1 is an exemplary example of a display system in the prior art.
Figure 2:
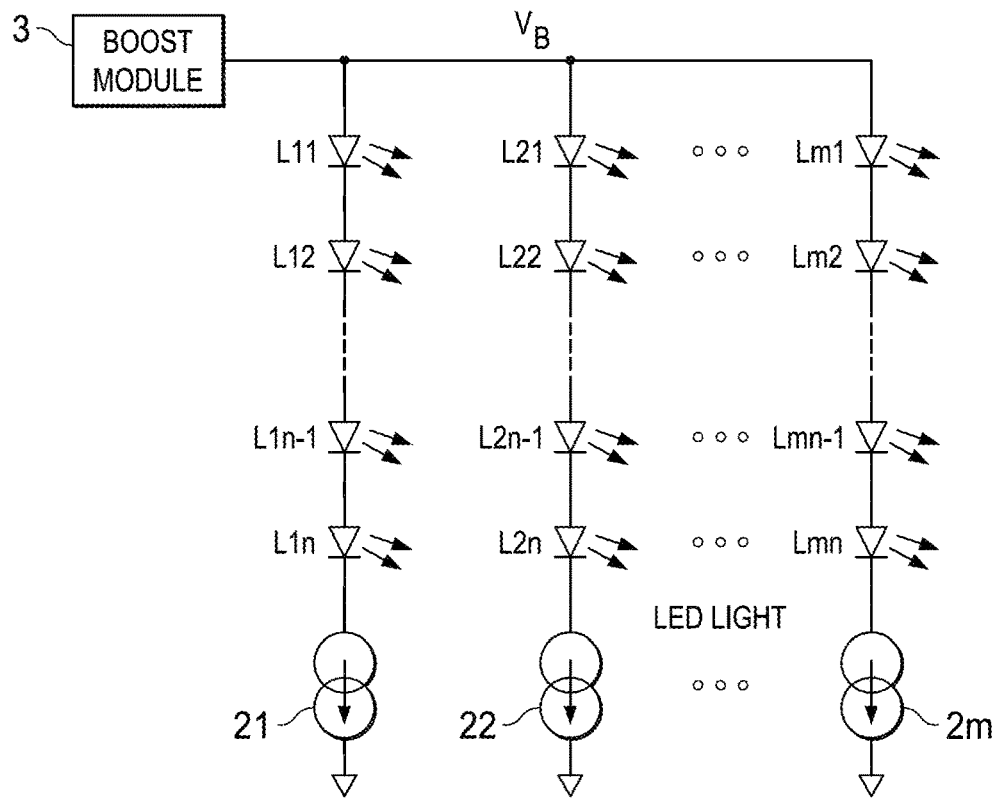
FIG. 2 is an exemplary example of a LED panel in the prior art.
Figure 3A:
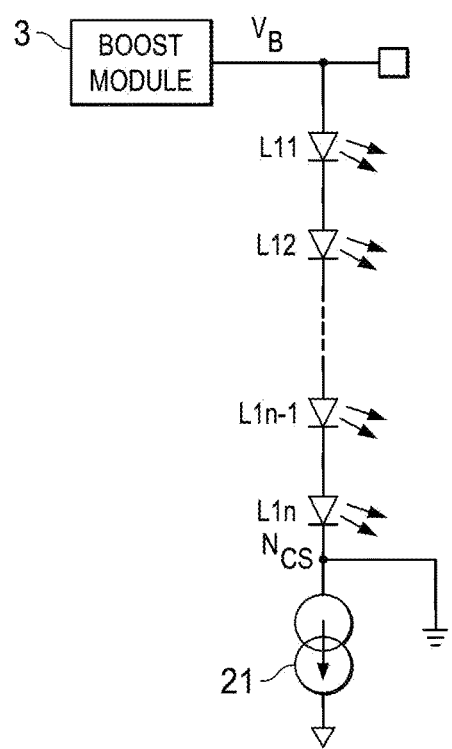
FIGS. 3A and 3B are examples of short-circuit fault and open-circuit fault in the LED panel, respectively.
Figure 3B:
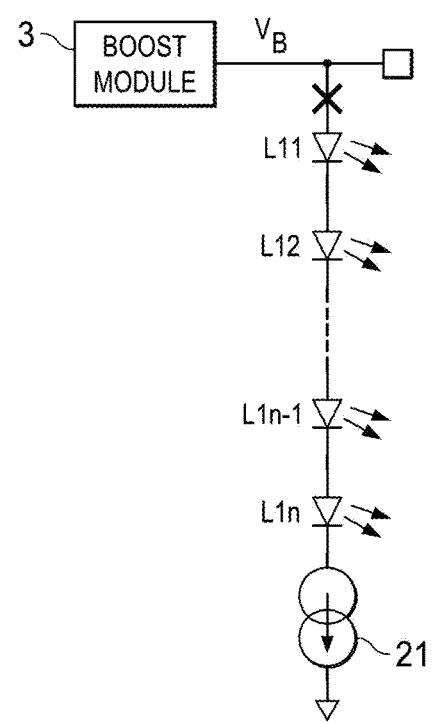

After step S627, when it is determined that the node $N_{cs}$ voltage is smaller than the threshold, for example, as shown in step S6291, the driving apparatus is disabled, like in step S6191. When it is determined that the voltage on the node $N_{cs}$ is greater than or equal to the threshold, it indicates that the fault type is open circuit; therefore, it is allowed to only disable the driving current source module 21 and the corresponding LED string, while other driving current source modules (such as the driving current source module 2m) are not affected. Since the LED panel includes a LED array as shown in FIG. 2, the above steps may be performed in turns according to the LED string or performed simultaneously. Besides, detection of the voltage on the runtime node $N_{cs}$ may be performed continuously or as per a certain time interval. The advantage of continuous detection lies in real-time finding of faults, while the advantage of periodical detection lies in saving power.

Figure 7:
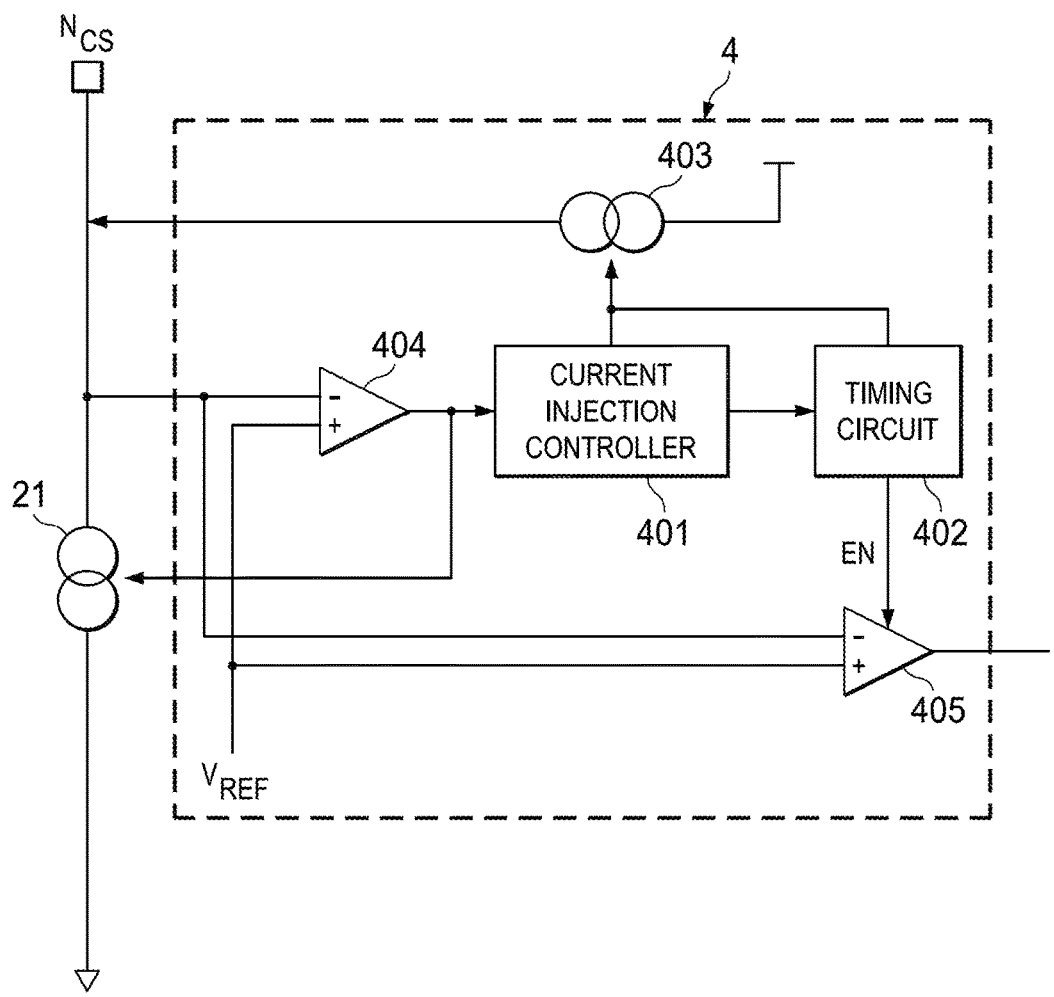
FIG. 7 is an example of a driving apparatus that has a protection module and is configured to drive a light emitting device according to one embodiment.

FIG. 7 shows another example of the protection circuit 4. In FIG. 7, the protection circuit 4 comprises a current injection controller 401, a timing circuit 402, an injection current source 403, a first comparator 404 and a second comparator 405. In this example, the voltage on the node $N_{cs}$ is detected continuously. The voltage is directly fed to an inverted end of the first comparator 404 so as to compare with the reference voltage $V_{REF}$ received at the in-phase end of the first comparator 404. In this case, the abovementioned voltage detecting circuit 43 is omitted. In other words, the voltage detecting circuit may correspond to the electrical connection between the node and the first comparator 404. The $V_{REF}$ may be the above threshold voltage $V_{TH2}$. When it is determined that the voltage on the $N_{cs}$ is smaller than $V_{TH2}$, the first comparator 404 outputs a signal to disable the driving current source module 21. Besides, the signal is also fed to the current injection controller 401. The controller 401 starts the injection current source 403 based on the signal so as to inject current to the node $N_{cs}$. Moreover, the current injection controller 401 also starts the timing circuit 402 such that the timing control circuit 402 controls the time for current injection, e.g., 100 milliseconds. Although the current injection controller 401 and the timing control circuit 402 are shown as separate modules in FIG. 7, those skilled in the art may understand that the current injection controller 401 may be designed to have a timing function, thereby sparing a separate timing circuit 402. The timing circuit 402 outputs an enabling signal EN to the second comparator after a period of time, such that the second comparator 405 compares the node voltage as received at the inverted end with the reference voltage $V_{REF}$ as received in-phase. When the node voltage is smaller than the reference voltage $V_{REF}$, the second comparator 405 outputs a signal of disabling the driving apparatus as mentioned above, while when the node voltage is greater than or equal to the reference voltage $V_{REF}$, the second comparator 405 outputs a signal of disabling the driving current source module 21 as mentioned above. Another example of the protecting circuit 4 has been described above with respect to runtime detection and protection. Those skilled in the art would understand that the protection circuit may also be used to detect circuit faults before starting the driving apparatus and the light emitting device, e.g., the first comparator 404 is controlled to output a disable signal to the driving current source module 21 before startup of the driving apparatus and the light emitting device, while the output of the second comparator 405 may be used to indicate whether a short-circuit fault of the light emitting device exists. Besides, those skilled in the art may also understand that, other circuit design than the protection circuits as shown in FIGS. 5 and 7 may also exist, as long as it can perform the method for detecting and protecting as shown in FIGS. 6A and 6B.

A driving apparatus for detecting a fault of a light emitting device such as LED panel and a method for detection and protection has been described above with respect to an embodiment. Complex detection circuit is not needed and interference brought by external circuits is thus avoided, since the protection circuit, the boost module, the driving current source and the like can be integrated into a same IC chip. Furthermore, the skilled in the art, upon review of the above embodiment, will appreciate that the driving apparatus for detecting a fault of a light emitting device such as LED panel and a method for detection and protection of the invention is simple in the sense of circuit design, and can provide real-time detection and protection to the driving apparatus.

Figure 8:
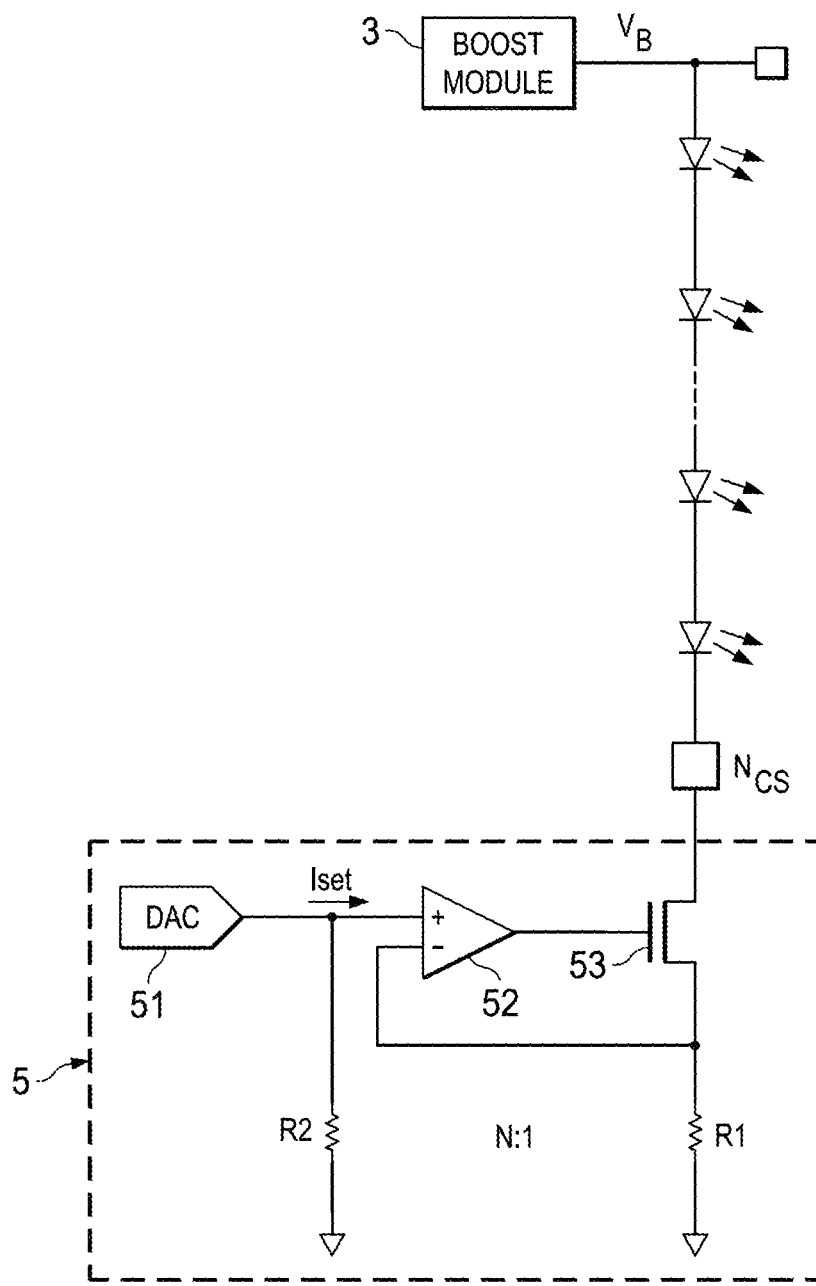
FIG. 8 is an example of a driving apparatus for driving a light emitting device according to one embodiment.

FIG. 8 shows configurations of a driving apparatus 5 and a light emitting device according to another embodiment. In FIG. 8, for the sake of illustration, only one LED string in the LED panel/array as shown in FIG. 2 is illustrated, which LED string is powered by the boost module and coupled to the driving apparatus 5 via the node $N_{cs}$ so as to be driven by the driving apparatus 5. Those skilled in the art may understand that the node $N_{cs}$ may be any point in the LED string between the LED connected to the driving apparatus 5 and the current source, e.g., when the current source is integrated into the driving apparatus while the LED string is integrated into the light emitting device, the node $N_{cs}$ may be a pin of the driving apparatus connected to the light emitting device. Those skilled in the art may understand that the boost module and the driving current source module 5 in FIG. 8 may be integrated into one integrated circuit chip, or located in different integrated circuit chips. Besides, the driving apparatus 8 may include a protection module 4 as mentioned above. In order to make FIG. 8 much clearer, the protection module 4 is not shown in FIG. 8. From the perspective of function, the driving apparatus 5 in FIG. 8 is similar to the driving current source module 21 in the previous embodiment and can be used in exchange in certain circumstances (e.g., in low-light state). When a light emitting device such as LED panel is in a low-light state (i.e., the LED panel is in a low-illumination brightness), the driving apparatus always performs dimming in a pulse width modulation (PWM) mode. For example, with reference to FIG. 8, in a low-light state, a digital/analog converter (DAC) 51 supplies current $I_{SET}$ to an operational amplifier 52. Since only a very small part of current $I_{SET}$ flows into the in-phase end of the operational amplifier 52, which is so small that it can even be ignored, the current flowing through a resistor R2 is substantially equal to the current $I_{SET}$. The resistor R2 and one end of the resistor R1 are connected to the same potential, e.g., grounded. Therefore, in this case, the voltage V+ at the in-phase end of the operational amplifier 52 is substantially equal to $R2*I_{SET}$. Since the voltages at two input ends of the operational amplifier 52 are substantially equal, the voltage V− at the inverted end of the operational amplifier 52 is also substantially equal to $R2*I_{SET}$. Likewise, the current flowing through the switch 53 is substantially equal to the current flowing through the resistor R1. Therefore, the following equation (1) may be derived:

$$R2*I_{SET}=R1*I_L \quad (1)$$

wherein, $I_{SET}$ is dimming current, while $I_L$ is current flowing through the diode string. Therefore, dimming of the LED panel may be realized through changing $I_{SET}$ (i.e., change the value of $I_L$). The above equation (1) may be revised as:

$$I_L=I_{SET}*R1/R2=I_{SET}*N \quad (2)$$

wherein N denotes the ratio between the resistance values of R1 and R2.

In a conventional PWM mode, N is a constant value. Therefore, dimming the LED panel is realized by changing the $I_{SET}$ outputted by the DAC. As stated above, dimming in the conventional PWM mode has a delay, i.e., the delay between the PWM signal and the $I_L$ current, which causes the driving current to be inaccurate, such that the illumination brightness of the LED panel in the low-light state is also inaccurate, which, however, is not desirable.

Figure 9:
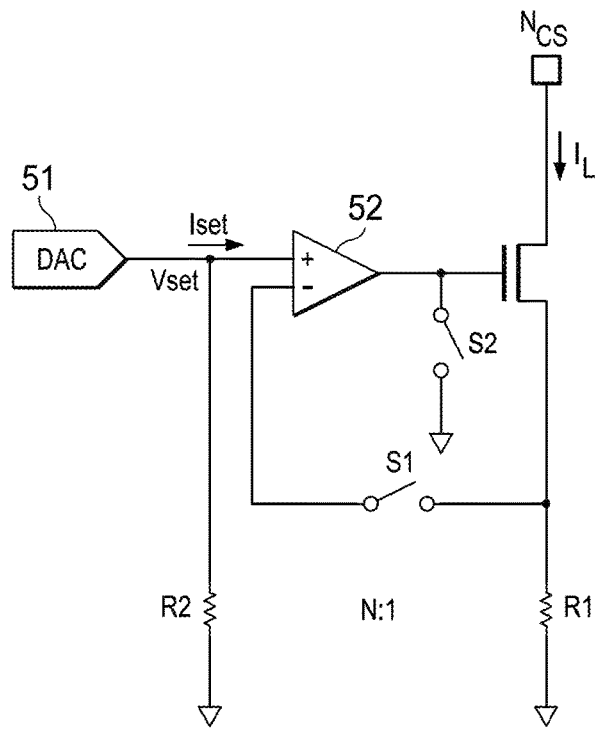
FIG. 9 is an example of a driving apparatus according to one embodiment.

Hereinafter, refer to FIG. 9 and FIG. 10, in which the operation and delay of the LED in the PWM mode are presented. For the convenience of illustration, FIG. 9 only illustrates the driving apparatus 5. The circuit configuration in FIG. 9 is substantially similar to reference numeral 5 in FIG. 8, except that a first switch S1 and a second switch S2 controlled by the PWM signal are added in FIG. 9. The operation of the operational amplifier 52 and the on and off of the NMOS 53 are realized through switching on and off of the first switch S1 and the second switch S2. Those skilled in the art may understand that the switches S1 and S2 may be implemented by any device capable of performing a high-speed switch function such as MOS transistor, bi-polar transistor, and the like. The NMOS 53 is only an example, and it may also be implemented by a PMOS or a bi-polar transistor and the like.

Figure 10:
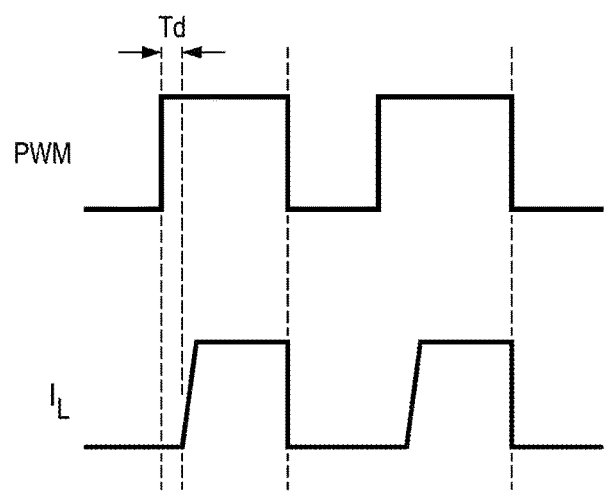
FIG. 10 is an example of delay between a PWM signal and a driving current.

Refer to FIG. 10. The PWM pulse signal is similar to a stepped square-wave signal, for controlling the on and off of the first and second switches S1 and S2. When PWM signal is 0, the first switch S1 is off and the second switch S2 is on. At this point, the operational amplifier 52 has no inverted end input, and the output of the operational amplifier 52 is grounded, which causes off-state of the NMOS 53; therefore, no current $I_L$ flows through the resistor R1. When the PWM signal is stepped from 0 to 1, the S1 is on, and S2 is off; the circuit at this point is similar to the circuit as shown in FIG. 8. The output of the operational amplifier 52 is a high level, such that the NMOS 53 is conductive, and $I_L$ flows through the resistor R1. The average illumination brightness of the LED may be dimmed by adjusting the duty ratio of the PWM. The studies show that in an actual operation process, there is always a delay between the stepped of the PWM signal and the current $I_L$, e.g., referring to FIG. 10, a delay $T_d$ exists between the PWM signal and the current IL, which causes the dimming inaccurate. Therefore, it is expected that delay can be reduced.

In the prior art, a more complex operational amplifier was designed to reduce the delay $T_d$. This causes significant increase of the manufacturing costs of the driving apparatus and causes increase of the chip size. In the circuit configurations in FIG. 8 and FIG. 9, the studies show that the delay $T_d$ is mainly caused by the operational amplifier 52. Further study shows that the response of the operational amplifier 52 may be improved mainly through the following two manners: one being a burst mode, namely, promoting the current flowing through a differential transconductance stage within the operational amplifier 52 at the initial phase immediately following the PWM signal conversion (e.g., 200 nanoseconds) to improve the response of the operational amplifier 52, thereby reducing the delay $T_d$ between the PWM signal step and the current $I_L$; the other manner being boosting the voltage $V_{set}$ at the input end of the operational amplifier when the current flowing through the LED is too small, thereby improving the response of the operational amplifier 52.

Hereinafter, the two manners will be described, respectively.

Figure 11:
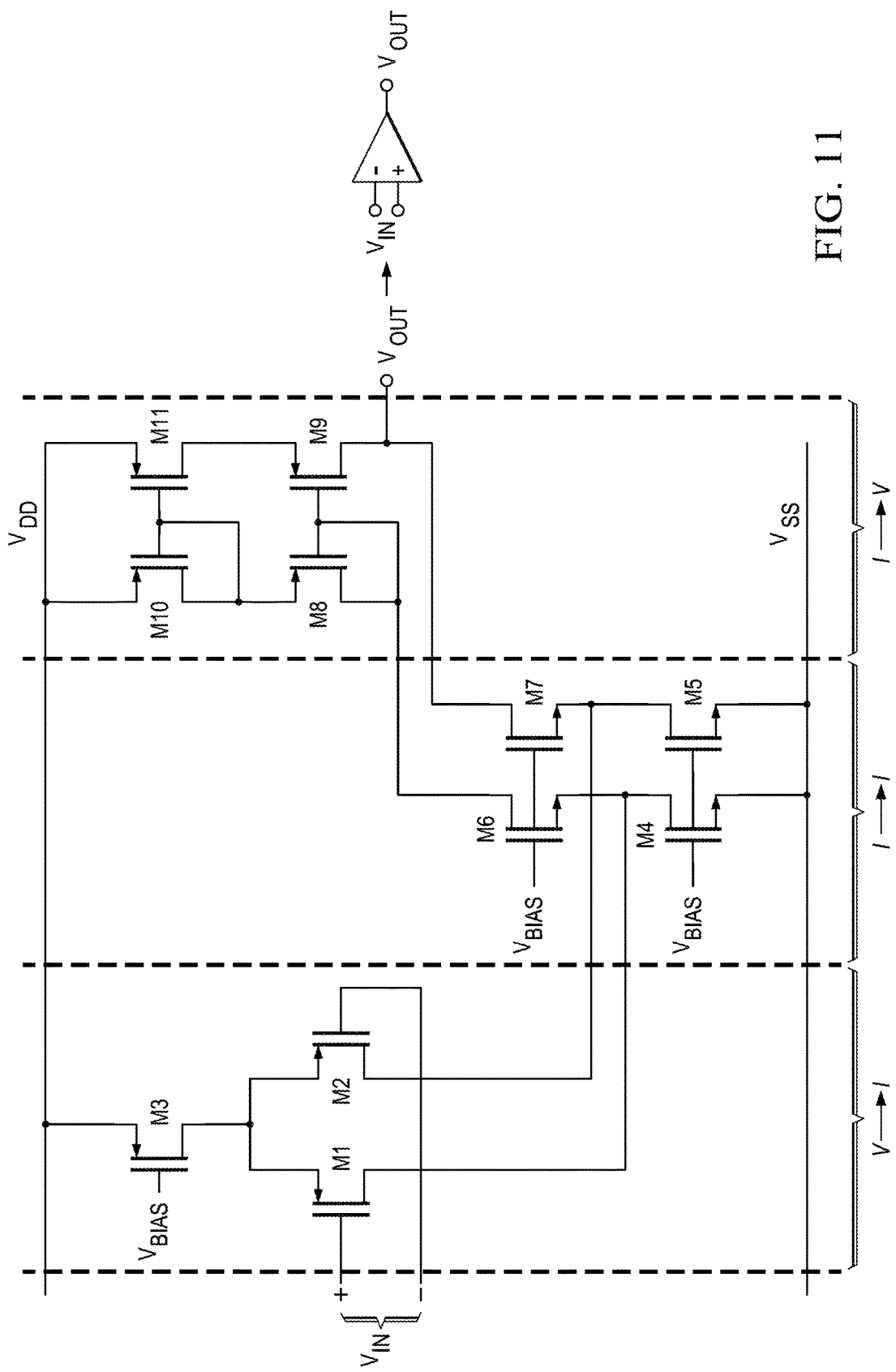
FIG. 11 is a circuit diagram of an operational amplifier of a driving apparatus.

FIG. 11 shows an exemplary operational amplifier according to one embodiment. The operational amplifier is a typical folded cascode operational amplifier, comprising three parts: differential transconductance stage, current stage, and cascode current mirror load. In FIG. 11, the three parts are separated by dotted lines. As shown in FIG. 11, the differential transconductance stage is concatenated with the current stage and immediately follows the cascode current mirror load. The differential transconductance stage comprises a pair of differential input transistors M1 and M2, with one ends being coupled to the transistor M3 and the other end being coupled to the current stage. The current stage comprises transistors M4, M5, M6, and M7, coupled between a transconductance input stage and the cascode current mirror. The cascode current mirror comprises intercoupled transistors M8, M9, M10, and M11. This kind of operational amplifier may further comprise a compensation circuit, such as Miller compensation. Those skilled in the art may understand that the folded operational amplifier in this embodiment may be modified, and a part of devices or sub-circuits may be added or deleted according to the actual requirement.

Figure 12:
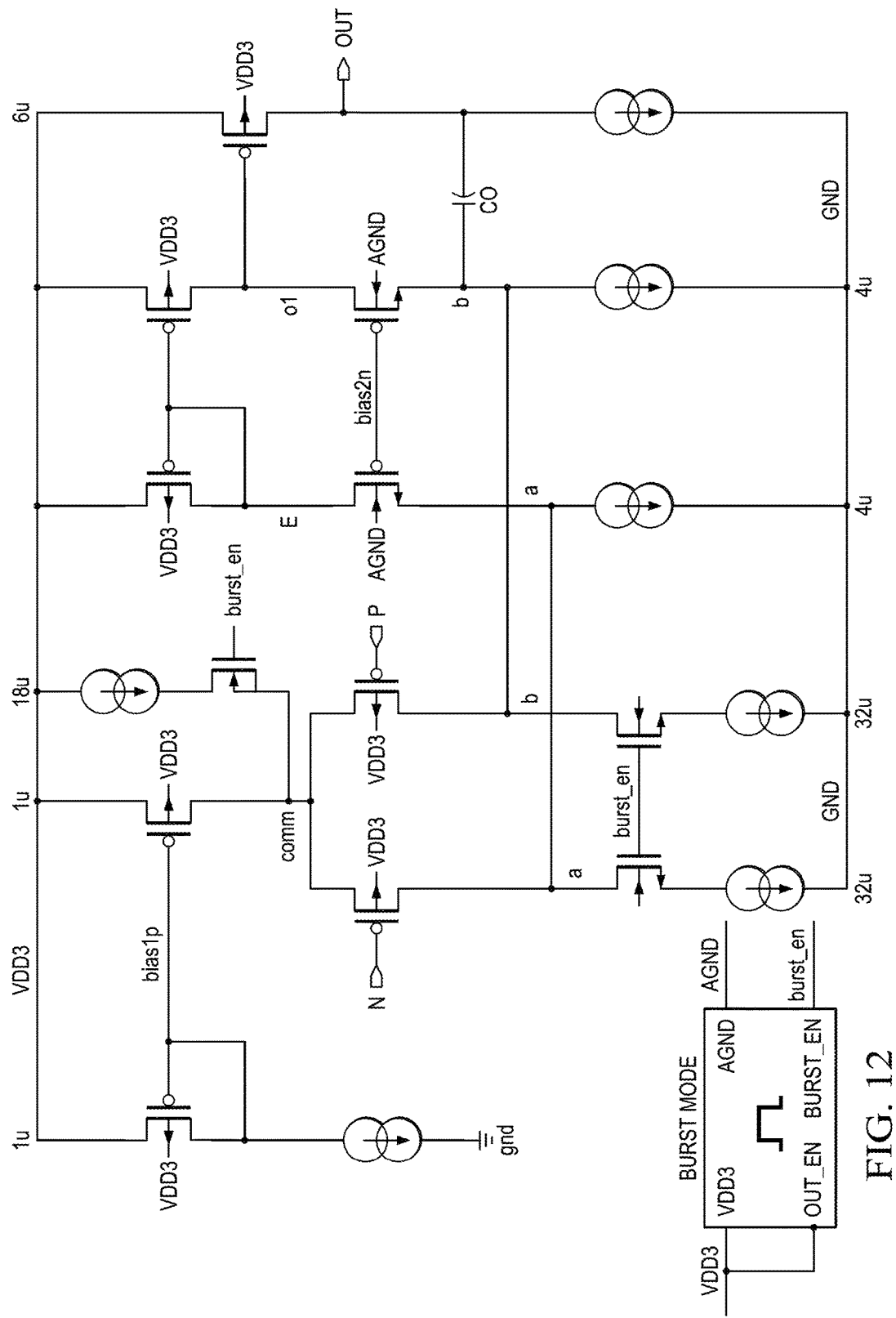
FIG. 12 is a circuit diagram of an operational amplifier of a driving apparatus.

FIG. 12 shows an exemplary operational amplifier according to another embodiment. The operational amplifier is a folded operational amplifier comprising a Miller compensation capacitor C0. The improvement of the embodiment in FIG. 12 over the embodiment in FIG. 11 lies in adding three additional current source circuits. As shown in FIG. 12, in the differential transconductance stage, the ends of a pair of differential input transistors are coupled to a current source circuit which is functionally similar to the transistor M3 in FIG. 11, while the other ends are coupled to the current stage at the right side of the differential transconductance stage. In order to increase the response of the operational amplifier, at one end of the differential input transistor, a first additional current source circuit coupled to the current mirror circuit is added, which comprises one current source and one NMOS transistor, and at the other end of the differential input transistor, a second and a third additional current source circuits are added, comprising one current source and one NMOS transistor, respectively. The three NMOS transistors are controlled by a burst_en signal, respectively, so as to maintain a high level and last a certain period of time (e.g., 200 ns) upon PWM signal step (e.g., from 0 to 1, or from 1 to 0). When the NMOS transistor is conducted, the three additional current source circuits are conducted and provide additional current to co-operate, thereby increasing the charging speed for the Miller compensation capacitor C0. In this way, the output response of the folded operational amplifier in this embodiment is improved. Those skilled in the art should understand that other implementation manners may also be available, for example, increasing the current provided by the current mirror circuit at one end of the differential input transistor in FIG. 2, and increasing the current of the current source in the current stage. Those skilled in the art may also understand that the above embodiments are only exemplary, not intended for restriction. For other type of operational amplifiers, their response may also be promoted by increasing the internal current upon PWM signal step.

Figure 13:
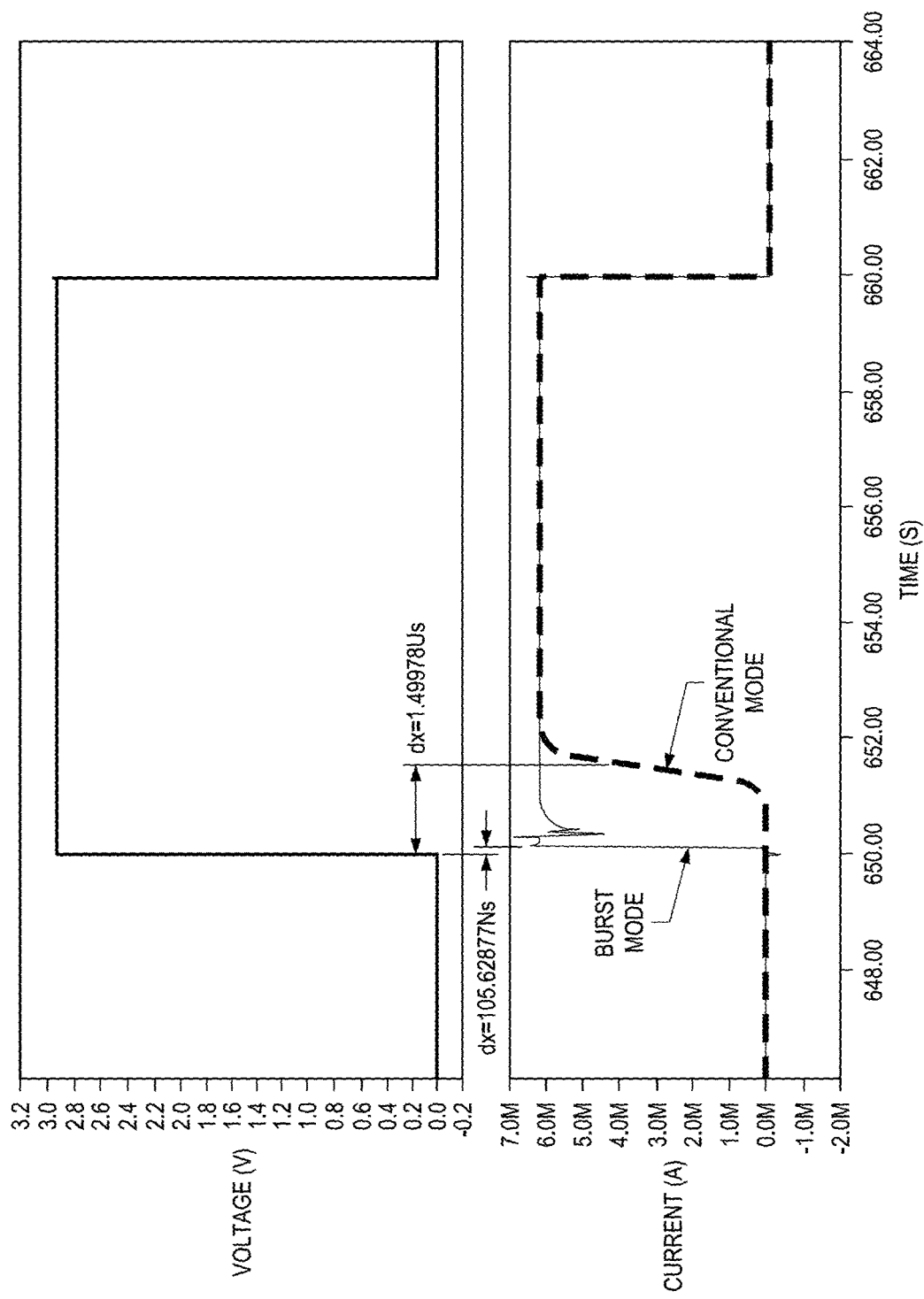
FIG. 13 is a diagram of a simulation result of the embodiment according to FIG. 12.

FIG. 13 shows a simulation diagram according to one embodiment. The upper part of FIG. 13 depicts a PWM pulse signal, while the lower part of FIG. 13 depicts a current $I_L$ curve with use of a burst mode and a current $I_L$ curve without use of a burst mode (conventional mode) for comparison therewith. FIG. 13 shows that, in the conventional mode, the delay $T_d$ is about 1.5 microseconds, while in the burst mode, the delay $T_d$ is about 75 nanoseconds, which is far less than the 1.5 microseconds. It is seen that using the burst mode at the initial phase of the PWM pulse signal conversion may greatly reduce the response delay of the operational amplifier, such that the LED panel dimming in a low-light state becomes more accurate (because the accuracy of the current is higher). Besides, compared with the driving apparatus using a more complex operational amplifier, the design of the driving apparatus according to the embodiments is much simpler, which effectively reduces the power consumption of the driving apparatus and also significantly reduces the chip occupied area when it is completely integrated in the chip.

Another manner of improving the delay caused by the operational amplifier involves boosting the voltage at the input end of the operational amplifier when the current $I_L$ flowing through the LED. As stated above, and as shown in FIGS. 8 and 9, the studies show that the response of the operational amplifier may be improved by boosting the voltage $V_{set}$. Since the voltages at the in-phase end and the inverted end of the operational amplifier 52 when operations are substantially identical, when the first switch S1 is on, the voltage at one end of R1 connected to the first switch (suppose the other end of R1 is grounded) is equal to Vset; therefore, when boosting the Vset voltage, the voltage at one end of R1 connected to the first switch is also boosted accordingly. For the circuit structures as shown in FIGS. 8 and 9, the current $I_L$ usually maintains unchanged, because it needs to guarantee the accuracy of the LED panel illumination brightness. Therefore, the resistance value of the resistance R1 needs to be increased correspondingly.

Figure 14A:
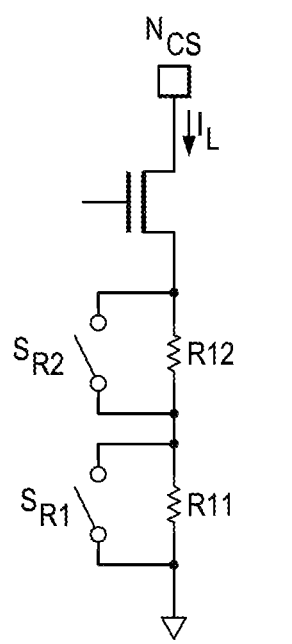
FIGS. 14A and 14B are examples of a resistance unit according to one embodiment.
Figure 14B:
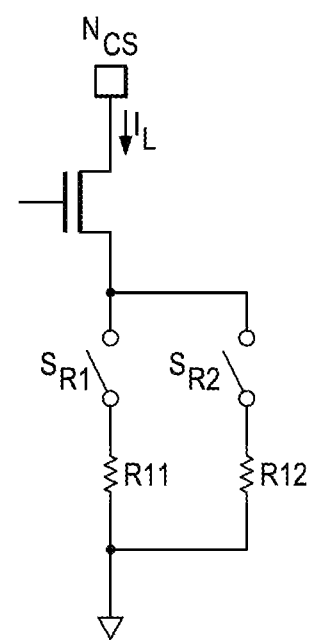

In one example, the resistor R1 comprises a plurality of serially connected resistors, and switches connected in series with the resistors, respectively. For example, as shown in FIG. 14A, the resistor R1 comprises two resistors R11 and R12, and switches $S_{R2}$ and $S_{R1}$ connected in series therewith, respectively. When the $I_L$ is relatively low, the switch $S_{R2}$ which was originally on is switched off, thereby increasing the resistance of the resistor R1. In another example, the resistor R1 comprises a plurality of parallel connected resistors and switches connected in series therewith, respectively. For example, as shown in FIG. 14B, the resistor R1 comprises two resistors R12 and R11, and switches $S_{R2}$ and $S_{R1}$ connected in series therewith, respectively. When the $I_L$ is relatively low, the switch $S_{R2}$ which is originally on is switched off, thereby increasing the resistance of the resistor R1. Those skilled in the art may understand that the above examples are only illustrative, not intended to limit that the resistor R1 only includes R11 and R12. The resistor R1 may comprise more serially connected resistors, and switches connected in parallel therewith, respectively. The resistor R1 may be implemented by polycrystalline silicon, MOS transistor, and the like, while the switches may be implemented by a high-speed switch such as MOS transistor or bi-pole transistor, and the like, so as to facilitate integration.

On the other hand, for example, with reference to FIG. 9, because Vset needs to be increased, it can be implemented in two manners. One manner is correspondingly increasing Iset, and the other manner is correspondingly increasing the resistance of the resistor R2. A manner similar to increasing the resistance of resistor R1 as described with reference to FIGS. 14A and 14B may be used to increase the resistance of the resistor R2. In one example, when $I_L$ is relatively low, the resistance of the resistor R1 and that of the resistor R2 are increased with the same proportion, thereby maintaining a proportion of 1:N. In another example, when the $I_L$ is relatively low, the resistance of the resistor R2 is increased, and Iset is increased, but the product of multiplication of the increase proportion of the resistor R2 and that of the current Iset is equal to the increase proportion of the resistor R1. In a further example, when $I_L$ is relatively low, the current value of Iset is decreased, while the resistance of the resistor R2 is increased, but the product of multiplication of the increase proportion of the resistor R2 and the decrease proportion of the current Iset is equal to the increase proportion of the resistor R1. In a still further example, when $I_L$ is relatively low, the current value of Iset is increased, while the resistance of the resistor R2 is decreased, but the product of multiplication of the decrease proportion of the resistor R2 and the increase proportion of the current Iset is equal to the increase proportion of the resistor R1.

Generally speaking, the method according to one embodiment may improve the response of the operational amplifier by shortly (e.g., 200 ns) increasing the current flowing through the differential transconductance stage within the operational amplifier upon PWM signal conversion (e.g., from low to high or from high to low) when performing dimming to a light emitting device such as LED panel in a PWM dimming mode. The method according to another embodiment may improve the response of the operational amplifier by boosting the voltage at the input of the operational amplifier in the driving apparatus and increasing the resistance of the resistor through which the driving current flows when $I_L$ is relatively low.

Increasing the resistance of the resistor unit through which the driving current flows may be realized by using the resistors as described above with reference to FIGS. 14A and 14B. Boosting the voltage at the input may be realized by changing the resistance value of another resistor unit coupled to the input of the operational amplifier or changing the current flowing through said another resistor unit.

Those skilled in the art may understand that the above two methods of improving the response of operational amplifier may be used individually, or in combination to achieve a better effect. Those skilled in the art may understand, the LED panel/array used in the above embodiments are only for illustration, rather than for limitation. Other types of light emitting devices may also apply here. Besides, the driving apparatus and light emitting device involved here and the corresponding methods may also be applied to various electronic devices employing such as LED panel/array, for example, a liquid crystal display, a LCD TV, a computer, a mobile phone, a player, or a personal digital assistant. For example, in a mobile cellular phone, the processor may control a driving apparatus according to the embodiments which may be included in a mobile cellular phone according to instructions stored in the memory, to drive a display screen of the mobile cellular phone. Besides, those skilled in the art may understand, various apparatuses, devices and modules and the like as stated herein may be implemented by a circuit, an integrated circuit, or a chip. Therefore, these terms may be used in exchange and have similar or identical meanings.

Some embodiments have been described above. In general, according to one embodiment, there is provided a driving apparatus for driving a light emitting device, comprising: a driving current source module configured to supply current to the light emitting device via a node during operation; a protection module coupled to the node and the driving current source module and configured to selectively inject current to the node during operation and control the driving current source module based on a detection result of a voltage on the node.

In the driving apparatus, the protection module is further configured to control a boost circuit coupled to the light emitting device, wherein the boost circuit is for supplying voltage to the light emitting device.

In the driving apparatus, the protection module is further configured to disabling the driving current source module before startup of the driving apparatus; inject current into the node; detect a voltage on the node; and enable or disable the driving apparatus based on the detected voltage.

In the driving apparatus, the protection module is further configured to disable the driving apparatus when the detected voltage on the node is smaller than a threshold voltage; and enable the driving apparatus when the detected voltage on the node is greater than or equal to the threshold voltage.

In the driving apparatus, the production module is further configured to detect a voltage on the node when the driving apparatus is running, and disable the driving current source module when it is detected that the voltage on the node is smaller than a threshold voltage; inject current into the node; detect a voltage on the node; and select disabling the whole driving apparatus or only disabling the driving current source module based on the detected voltage.

In the driving apparatus, the protection module comprises: a current injection circuit configured to selectively inject current into the node; a voltage detection circuit configured to selectively detect a voltage on the node; and a controller configured to selectively control the driving apparatus, the current injection circuit, and the driving current source module.

In the driving apparatus, the protection module further comprises a timing circuit configured to control time when the current injection circuit injects current into the node.

In the driving apparatus, the controller comprises a first comparator and a second comparator, wherein the first comparator selectively transmits a first comparator output to the current injection circuit and the timing circuit based on output of the voltage detection circuit and a reference voltage; the second comparator selectively outputs a second comparator output for disabling the driving apparatus or the driving current source module based on output of the voltage detection circuit, the reference voltage and output of the timing module.

According to one embodiment, there is provided a display system, comprising a light emitting device and the driving apparatus for driving the light emitting device.

According to one embodiment, there is provided an electronic device comprising a display system.

The electronic device is a display, a LCD TV, a computer, a mobile phone, a player, or a personal digital assistant.

According to one embodiment, there is provided a method for protecting a display system, which display system comprises a light emitting device and a driving apparatus for driving the light emitting device, which light emitting device is coupled to a current source of the driving apparatus via a node, which method comprises: disabling the driving current source module before startup of the driving apparatus; injecting current into the node; detecting a voltage on the node; and determining whether to enable or disable the driving apparatus based on the detected voltage.

In the above method, if the detected voltage is smaller than a threshold voltage, the driving apparatus is disabled; if the detected voltage is greater than or equal to the threshold voltage, the driving apparatus is started.

According to one embodiment, there is provided a method for protecting a display system, which display system comprises a light emitting device and a driving apparatus for driving the light emitting device, which light emitting device is coupled to a current source of the driving apparatus via a node, which method comprises: detecting voltage on the node when the driving apparatus is running; disabling the driving current source module when it is detected that voltage of the node is less than a threshold voltage; injecting current into the node; detecting a voltage on the node; and selecting only disabling the driving current source module or disabling the entire driving apparatus based on the detected voltage.

In the above method, if the detected voltage is smaller than a threshold voltage, only the driving current source module is disabled; if the detected voltage is greater than or equal to the threshold voltage, the entire driving apparatus is disabled.

In the above method, when the driving apparatus is running, voltage on the node is detected continuously or periodically.

According to one embodiment, there is provided a driving apparatus for driving a light emitting device, comprising: a driving current source module configured to supply current to the light emitting device via a node during operation, wherein the driving current source module is configured to improve dimming accuracy by reducing delay caused by an operational amplifier included in the driving current source module when dimming in a pulse width modulation (PWM) mode.

In the driving apparatus, the operational amplifier comprises a first input, a second input, and an output. Besides, the driving current source module further comprises: a second resistor unit coupled between the first input and a ground; a first switch coupled to the second input; a first resistor unit coupled between the first switch and the ground; a second switch coupled between the output and a ground; a switch unit coupled between the light emitting device and the first resistor unit, which switch unit is configured to be controlled by the output to selectively conduct; and a controller, wherein the controller is configured to boost voltage at the first input and increase a resistance value of the first resistor unit.

In the driving apparatus, the controller is further configured to control to boost voltage at a first input of the optional amplifier through increasing a resistance value of the second resistor unit.

In the driving apparatus, the second resistor unit comprises a plurality of serially connected resistors, and a plurality of switches in parallel connection with respective resistors, wherein the controller is configured to increase a resistance value of the second resistor unit through selectively disconnecting a switch in the plurality of switches.

In the driving apparatus, the second resistor unit comprises a plurality of parallel connected resistors, and a plurality of switches in series connection with respective resistors, wherein the controller is configured to increase the resistance value of the second resistor unit by selectively disconnecting a switch in the plurality of switches.

In the driving apparatus, the controller is configured to control to boost voltage at a first input of the operational amplifier through increasing current flowing through the second resistor unit.

In the driving apparatus, the first resistor unit comprises a plurality of serially connected resistors, and a plurality of switches parallel connected to respective resistors, wherein the controller is configured to increase the resistance value of the first resistor unit by selectively disconnecting a switch in the plurality of switches.

In the driving apparatus, the first resistor unit comprises a plurality of parallel connected resistors, and a plurality of switches serially connected to respective resistors, wherein the controller is configured to increase the resistance value of the first resistor unit through selectively disconnecting a switch in the plurality of switches.

In the driving apparatus, the controller is configured such that proportion of voltage boost at the first input is identical to the proportion of increase of the resistance value of the first resistor unit, such that the current flowing through the first resistor unit keeps unchanged.

In the driving apparatus, the operational amplifier comprises a differential transconductance stage, and wherein the delay is reduced by increasing the current flowing through the differential transconductance stage upon PWM signal step.

In the driving apparatus, the operational amplifier further comprises a Miller compensation capacitor, wherein the delay is reduced by supplying power to the Miller compensation capacitor from increased current flowing through the differential transconductance stage upon PWM signal step.

In the driving apparatus, the differential transconductance stage comprises a pair of differential input transistors, one ends of which differential input transistors are coupled to a current mirror circuit, while the other end thereof is coupled to a current stage, wherein the differential transconductance circuit further comprises a first additional current source circuit connected in parallel to the current mirror circuit and a second additional current source circuit and a third additional current source circuit, which are coupled to the other ends of the pair of the differential input transistors, the first additional current source circuit, the second additional current source circuit, and the third additional current source circuit being configured to supply additional current upon PWM signal step.

In the driving apparatus, the increased current flowing through the differential transconductance stage lasts a predetermined period of time upon PWM signal step.

According to one embodiment, there is provided a display system comprising a light emitting device and the driving apparatus for driving the light emitting device.

According to one embodiment, there is provided an electronic device comprising a display system.

The electronic device is a display, a LCD TV, a computer, a mobile phone, a player, or a personal digital assistant.

According to one embodiment, there is provided a method for driving a light emitting device, comprising: improving dimming accuracy by reducing delay caused by an operational amplifier in the driving apparatus when dimming in a pulse width modulation (PWM) mode.

The method comprises reducing the delay through increasing an input voltage of the operational amplifier.

The method comprises reducing the delay by increasing current flowing through a differential transconductance stage in the operational amplifier upon PWM signal step.

Although the present invention has been disclosed with reference to a plurality of preferred embodiment, it should be understood that the present invention is not limited the disclosed preferred embodiments. The present invention intends to cover various modifications and equivalent arrangements within the spirit and scope of the appended claims. The scope of the appended claims conforms to the broadest explanations, thereby including all such modifications and equivalent structures and functions.

What is claimed is:

1. A method for driving a light emitting device, comprising:
    supplying a first current over a first current path directly to a node of said light emitting device to cause light production; and
    selectively injecting a second current over a second current path directly to said node of said light emitting device during a testing operation;
    detecting a voltage at said node; and
    controlling the supply of the first current in response to the detected voltage at said node.

2. The method according to claim 1, further comprising:
    disabling supply of the first current before entering a startup mode of operation;
    injecting the second current to the node;
    detecting the voltage at the node; and
    selectively supplying of the first current in response to the detected voltage.

3. The method according to claim 1, further comprising: disabling operation of the light emitting device when the detected voltage is smaller than a threshold voltage; and enabling operation of the light emitting device when the detected voltage on the node is greater than or equal to the threshold voltage.

4. The method according to claim 1, further comprising:
    detecting the voltage at the node while the first current is being supplied;
    disabling supply of the first current when the detected voltage is smaller than a threshold voltage;
    injecting the second current into the node;
    detecting an additional voltage at the node; and
    selectively disabling either operation of the light emitting device or supply of the first current based on the detected additional voltage.

5. The method according to claim 4, wherein selectively disabling comprises:
    disabling operation of the light emitting device when the detected additional voltage is smaller than a threshold voltage; and
    disabling supply of the first current the driving current source module when the detected voltage on the node is greater than or equal to the threshold voltage.

6. A method for protecting a display system which includes a light emitting device and a driving apparatus for driving the light emitting device, wherein the driving apparatus includes a current source coupled to supply a drive current to the light emitting device, the method comprising:
    disabling the current source before a startup of the driving apparatus;

injecting a test current into a node of the light emitting device;

detecting a voltage at the node in response to the injected test current; and determining whether to enable or disable the driving apparatus based on the detected voltage.

7. The method according to claim 6, wherein determining comprises:

disabling the driving apparatus if the detected voltage is smaller than a threshold voltage; and enabling the driving apparatus if the detected voltage is greater than or equal to the threshold voltage.

8. The method according to claim 6, wherein the drive current is supplied to the node over a first current path and the test current is supplied to the node over a second current path different from the first current path.

9. A method for protecting a display system which includes a light emitting device and a driving apparatus for driving the light emitting device, wherein the driving apparatus includes a current source coupled to supply a drive current to a node of the light emitting device, the method comprising:

detecting a voltage at the node when the driving apparatus is operating;

disabling the current source when the detected voltage at the node is smaller than a threshold voltage;

injecting a current into the node;

detecting a further voltage at the node in response to the injected current; and selectively disabling only the current source or disabling the driving apparatus based on the detected further voltage.

10. The method according to claim 9, wherein selectively disabling comprises:

disabling only the current source if the detected further voltage is greater than or equal to the threshold voltage; and disabling the driving apparatus if the detected voltage is smaller than the threshold voltage.

11. The method according to claim 9, wherein detecting the voltage at the node when the driving apparatus is operating comprises making the detection on a continuous basis.

12. The method according to claim 9, wherein detecting the voltage at the node when the driving apparatus is operating comprises making the detection on a periodic basis.

* * * * *